United States Patent
Yang et al.

(10) Patent No.: US 12,041,717 B2
(45) Date of Patent: Jul. 16, 2024

(54) RIGID FLEXIBLE PRINTED CIRCUIT BOARD AND ELECTRONIC DEVICE INCLUDING THE SAME

(71) Applicant: Samsung Electronics Co., Ltd., Gyeonggi-do (KR)

(72) Inventors: Hyunmo Yang, Gyeonggi-do (KR); Junwhon Uhm, Gyeonggi-do (KR); Yonghyun Park, Gyeonggi-do (KR); Yongwon Lee, Gyeonggi-do (KR); Sangwon Ha, Gyeonggi-do (KR)

(73) Assignee: Samsung Electronics Co., Ltd (KR)

(*) Notice: Subject to any disclaimer, the term of this patent is extended or adjusted under 35 U.S.C. 154(b) by 232 days.

(21) Appl. No.: 17/825,191

(22) Filed: May 26, 2022

(65) Prior Publication Data

US 2023/0007766 A1 Jan. 5, 2023

Related U.S. Application Data

(63) Continuation of application No. PCT/KR2022/007084, filed on May 18, 2022.

(30) Foreign Application Priority Data

Jul. 1, 2021 (KR) .......................... 10-2021-0086637

(51) Int. Cl.
*H05K 1/02* (2006.01)
*H05K 1/11* (2006.01)

(52) U.S. Cl.
CPC .......... *H05K 1/028* (2013.01); *H05K 1/0216* (2013.01); *H05K 1/0266* (2013.01); *H05K 1/115* (2013.01); *H05K 2201/0154* (2013.01)

(58) Field of Classification Search
CPC ..... H05K 1/0216; H05K 1/0278; H05K 1/028
See application file for complete search history.

(56) References Cited

U.S. PATENT DOCUMENTS

| | | |
|---|---|---|
| 10,727,568 B2 | 7/2020 | Cho et al. |
| 10,978,789 B2 | 4/2021 | Cho et al. |
| 2009/0129412 A1 | 5/2009 | Kim |

(Continued)

FOREIGN PATENT DOCUMENTS

| | | |
|---|---|---|
| JP | 2011-049367 | 3/2011 |
| JP | 2011-129554 | 6/2011 |

(Continued)

OTHER PUBLICATIONS

International Search Report dated Sep. 1, 2022 issued in counterpart application No. PCT/KR2022/007084, 5 pages.

*Primary Examiner* — Hung V Ngo
(74) *Attorney, Agent, or Firm* — The Farrell Law Firm, P.C.

(57) ABSTRACT

An electronic device is provided, which includes a PCB including a first alignment mark formed on a first surface of the PCB, and an RFPCB including a plurality of layers, a rigid portion disposed on the first surface of the PCB, a flexible portion extending from the rigid portion, and a first protrusion formed as one of the plurality of layers protruding and extending from the rigid portion. A second alignment mark corresponding to the first alignment mark of the PCB is defined in the first protrusion. The first protrusion overlaps at least partially with the first alignment mark of the PCB.

20 Claims, 9 Drawing Sheets

(56) References Cited

U.S. PATENT DOCUMENTS

| | | | |
|---|---|---|---|
| 2011/0199735 A1 | 8/2011 | Kawabata | |
| 2017/0358847 A1 | 12/2017 | Cho et al. | |
| 2019/0269009 A1* | 8/2019 | Park | H05K 1/028 |
| 2020/0093012 A1* | 3/2020 | Woo | H05K 3/365 |
| 2020/0127404 A1* | 4/2020 | Seo | H01R 12/79 |
| 2020/0267839 A1* | 8/2020 | Woo | H05K 5/0226 |
| 2020/0358166 A1 | 11/2020 | Cho et al. | |
| 2021/0226320 A1 | 7/2021 | Cho et al. | |
| 2021/0251071 A1* | 8/2021 | Lee | H05K 1/189 |
| 2021/0320444 A1* | 10/2021 | Lee | G06F 1/1656 |
| 2022/0287180 A1* | 9/2022 | Yang | G06F 1/183 |

FOREIGN PATENT DOCUMENTS

| | | |
|---|---|---|
| KR | 1020010036454 | 5/2001 |
| KR | 1020090093522 | 9/2009 |
| KR | 1020110044529 | 4/2011 |
| KR | 10-1180916 | 9/2012 |
| KR | 10-2053825 | 6/2014 |
| KR | 1020160080871 | 7/2016 |
| KR | 1020170140691 | 12/2017 |
| KR | 1020190036965 | 4/2019 |

* cited by examiner

RIGID FLEXIBLE PRINTED CIRCUIT BOARD AND ELECTRONIC DEVICE INCLUDING THE SAME

CROSS-REFERENCE TO RELATED APPLICATIONS

This application is a bypass continuation application, claiming priority under § 365(c) to International Application No. PCT/KR2022/007084, filed on May 18, 2022, which is based on and claims priority to Korean Patent Application Serial No. 10-2021-0086637, which was filed in the Korean Intellectual Property Office on Jul. 1, 2021, the entire disclosure of each of which is incorporated herein by reference in its entirety.

1. FIELD

The disclosure relates generally to a flexible printed circuit board (FPCB) and an electronic device including the same.

2. DESCRIPTION OF RELATED ART

An FPCB may be used as a medium for transmitting electrical signals to various electronic components of an electronic device. Because an FPCB for a board-to-board or component-to-component (or board) connection may be at least partially bent, it is possible to reduce space constraints for disposing the various components in the electronic device and operatively connecting the various components to each other.

For example, a hot bar method may be used to bond an FPCB to another printed circuit board (PCB). The hot bar method bonds the FPCB to the PCB by placing a pad portion of the FPCB (e.g., a portion where conductive pads are formed and bonded to the PCB) on the PCB, and then pressurizing and heating the FPCB using a hot bar.

In a hot bar process, positioning the pad portion of the FPCB on the PCB may require very high precision. To this end, alignment marks may be defined in and formed on the pad portion of the FPCB and the PCB, respectively.

An alignment mark in the pad portion of the FPCB may be formed to be substantially transparent or semi-transparent by removing some of layer(s) of the FPCB, or may be formed to allow transmission like a through hole via.

An alignment mark of the PCB may be formed as a copper foil layer having a specified shape (e.g., a square). The pad portion of the FPCB may be accurately positioned on the PCB by identifying the alignment mark of the PCB located below the alignment mark formed on the pad portion of the FPCB, through the alignment mark formed on the pad portion of the FPCB.

However, because an FPCB has a limited wiring density, the FPCB may have a limit in connecting electronic components having a large number of terminals requiring electrical connections to each other within a limited mounting space.

To address such a problem, a rigid FPCB (RFPCB), which includes a rigid portion having mechanical strength and a flexible portion that may extend from the rigid portion and be at least partially bent, may be used. Because the RFPCB may be formed of a plurality of layers to have a high wiring density, and may have the flexible portion that may be bent, the RFPCB may contribute to high integration of electronic components and miniaturization of an electronic device.

However, alignment is still required to bond conductive pads disposed in a rigid portion of the RFPCB with conductive pads of a PCB, and it may be difficult to define an alignment mark in the rigid portion of the RFPCB. Because the rigid portion of the RFPCB includes a structure in which a plurality of layers are stacked, even when some of the layers are removed, it may be difficult for the rigid portion to have a transmittance required to identify an alignment mark of the PCB below the RFPCB. In addition, because wiring lines constituting a circuit pattern of the RFPCB are often three-dimensionally connected to the pads in the rigid portion, it may be difficult to define a through hole via that allows the identification of the PCB alignment mark, without interfering with paths to be routed with the pads.

SUMMARY

Accordingly, an aspect of the disclosure is to provide an RFPCB including a plurality of layers with a way for identifying a position alignment with a PCB, and an electronic device including the same.

According to an aspect of the disclosure, an RFPCB is provided, with which it is possible to identify a position alignment with a PCB while having a high wiring density by being formed in multiple layers.

According to another aspect of the disclosure, position alignment with a PCB may be identified through an alignment mark defined in a protrusion extending from a rigid portion of an RFPCB.

According to another aspect of the disclosure, through a multi-layered RFPCB including an area for identifying a position with respect to a PCB, a defect rate in bonding the RFPCB to the PCB may be reduced while reducing constraints of space required to operatively connect electronic components to each other.

In accordance with an aspect of the disclosure, an electronic device is provided, which includes a PCB including a first alignment mark formed on a first surface of the PCB, and a RFPCB including a plurality of layers, a rigid portion disposed on the first surface of the PCB, a flexible portion extending from the rigid portion, and a first protrusion formed as one of the plurality of layers protruding and extending from the rigid portion. A second alignment mark corresponding to the first alignment mark of the PCB is defined in the first protrusion. The first protrusion overlaps at least partially with the first alignment mark of the PCB.

In accordance with another aspect of the disclosure, an RFPCB is provided, which includes a plurality of layers bonded to a PCB, a rigid portion disposed on a first surface of the PCB, a flexible portion extending from the rigid portion, and a first protrusion formed as one of a plurality of layers protruding and extending from the rigid portion. A second alignment mark corresponding to a first alignment mark formed on the first surface of the PCB is defined in the first protrusion. The first protrusion overlaps at least partially with the first alignment mark of the PCB.

BRIEF DESCRIPTION OF THE DRAWINGS

The above and other aspects, features, and advantages of certain embodiments of the disclosure will be more apparent from the following detailed description taken in conjunction with the accompanying drawings, in which.

DETAILED DESCRIPTION

Hereinafter, various embodiments of the disclosure will be described with reference to the accompanying drawings. However, this description is not intended to limit the disclosure to specific embodiments, and it should be understood that various modifications, equivalents, and/or alternatives of the embodiments of the disclosure are also available.

Figure 1A:
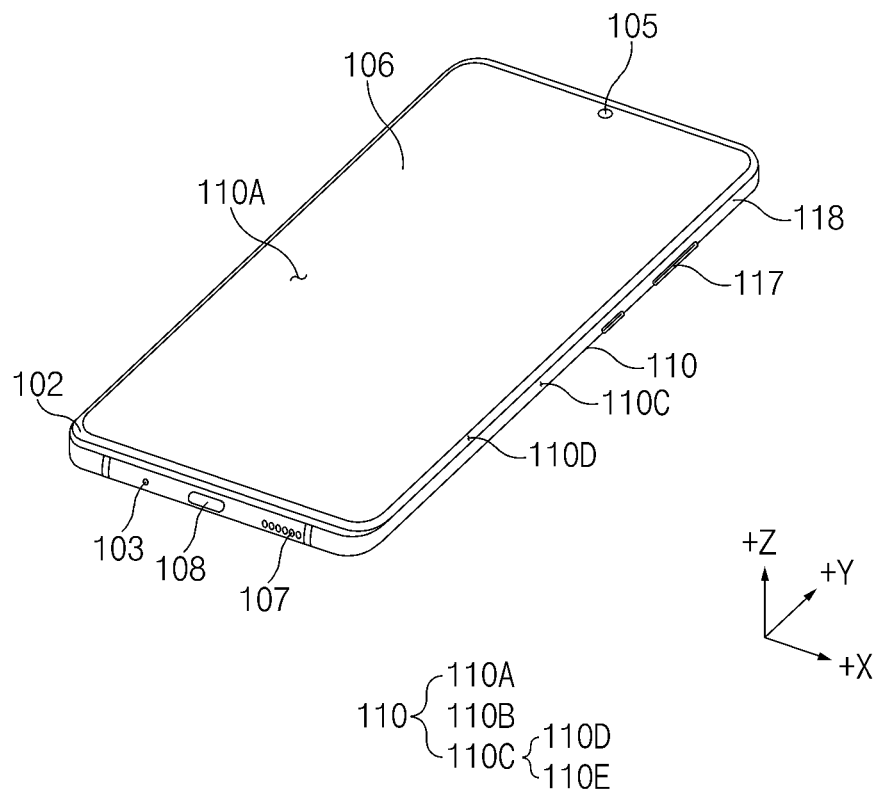
FIG. 1A illustrates a front view of an electronic device according to an embodiment.

FIG. 1A illustrates a front view of an electronic device according to an embodiment.

Figure 1B:
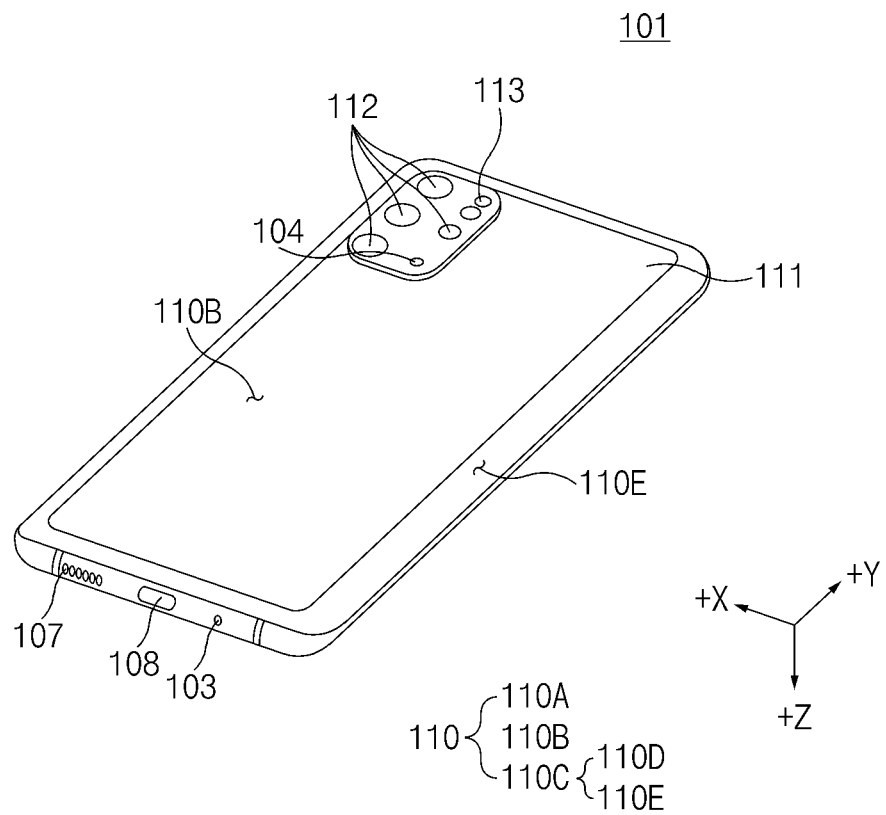
FIG. 1B illustrates a rear view of an electronic device according to an embodiment.

FIG. 1B illustrates a rear view of an electronic device according to an embodiment.

Referring to FIGS. 1A and 1B, an electronic device 101 (e.g., an electronic device 501 in FIG. 5) may include a housing 110 including a first surface (or a front surface) 110A, a second surface (or a rear surface) 110B, and a side surface 110C that encloses a space between the first surface 110A and the second surface 110B.

Alternatively, the housing 110 may refer to a structure that forms some of the first surface 110A, the second surface 110B, and the side surface 110C.

The first surface 110A may be formed by a front surface plate 102 (e.g., a glass plate including various coating layers, or a polymer plate) at least a portion of which is substantially transparent. The second surface 110B may be formed by a substantially opaque rear surface plate 111. The rear surface plate 111 may be formed by coated or colored glass, ceramic, polymer, metal (e.g., aluminum, stainless steel (STS), or magnesium), or a combination of at least two of the above materials. The side surface 110C may be formed by a side surface bezel structure (or a "frame structure") 118 that is coupled to the front surface plate 102 and the rear surface plate 111, and contains metal and/or polymer.

Alternatively, the rear surface plate 111 and the side surface bezel structure 118 may be integrally formed and may contain the same material (e.g., a metal material such as aluminum).

As illustrated in FIG. 1A, the front surface plate 102 may include two first regions 110D bent from a region of the first surface 110A in a direction of the rear surface plate 111. The first regions 110D may be located at ends of long edges of the front surface plate 102, respectively.

As illustrated in FIG. 1B, the rear surface plate 111 may include two second regions 110E bent from a region of the second surface 110B in a direction of the front surface plate 102. The second regions 110E may be located at ends of long edges of the rear surface plate 111, respectively.

Alternatively, the front surface plate 102 (or the rear surface plate 111) may include only one of the first regions 110D (or of the second regions 110E), or may not include at least one of the first regions 110D or the second regions 110E.

When viewed from the side surface 110C of the electronic device 101, the side surface bezel structure 118 may have a first thickness (or width) in a side surface direction (e.g., a short side) in which the first regions 110D or the second regions 110E as described above are not included, and may have a second thickness smaller than the first thickness in a side surface direction (e.g., a long side) in which the first regions 110D or the second regions 110E are included.

Figure 5:
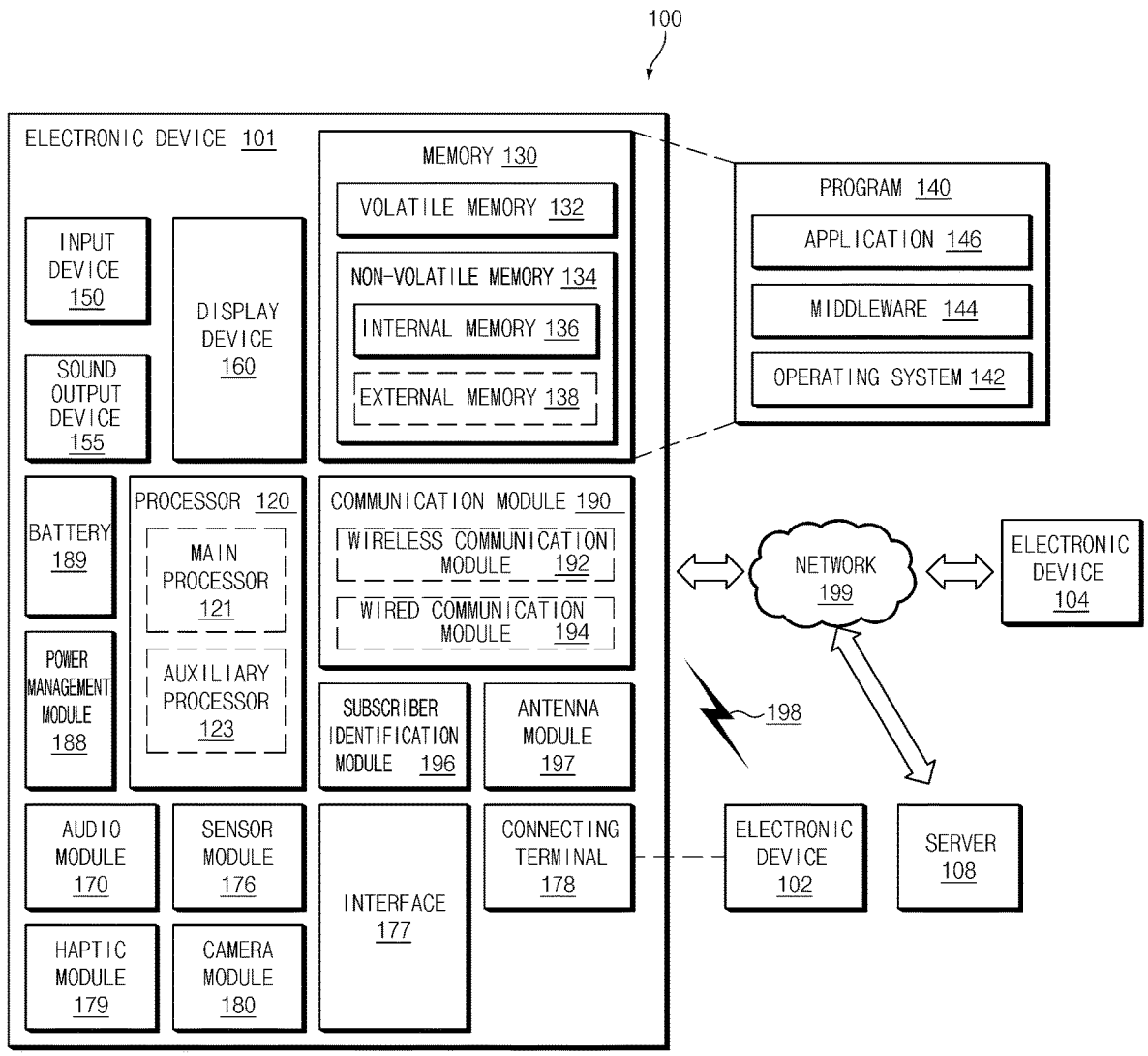
FIG. 5 illustrates an electronic device in a network environment, according to an embodiment.

The electronic device 101 may include at least one of a display 106, audio modules 103 and 107 (e.g., an audio module 570 in FIG. 5), a sensor module (not shown) (e.g., a sensor module 576 in FIG. 5), camera modules 105, 112, and 113 (e.g., a camera module 580 in FIG. 5), a key input device 117 (e.g., an input module 550 in FIG. 5), a light emitting device (not shown), and a connector hole 108 (e.g., a connecting terminal 578 in FIG. 5). Alternatively, the electronic device 101 may omit at least one of the illustrated components or include additional components.

The display 106 may be exposed through a substantial portion of the front surface plate 102. For example, at least a portion of the display 106 may be exposed through the front surface plate 102 including the first surface 110A and the first regions 110D of the side surface 110C.

An edge of the display 106 may be formed to have a shape that is substantially the same as a shape of an adjacent outer periphery of the front surface plate 102. Alternatively, a distance between an outer periphery of the display 106 and the outer periphery of the front surface plate 102 may be substantially the same, e.g., in order to expand an area to which the display 106 is exposed.

The front surface plate 102 of the housing 110 may include a screen display region defined as the display 106 is visually exposed. The screen display region may include the first surface 110A and the first regions 110D of the side surface.

The screen display region 110A and 110D may also include a sensing region for acquiring biometric information, e.g., a fingerprint, of a user. Accordingly, at least a portion of the sensing region may overlap the screen display region 110A and 110D. The sensing region may display visual information from the display 106 like other regions of the screen display region 110A and 110D, and also acquire the biometric information of the user.

The screen display region 110A and 110D of the display 106 may include a region in which the first camera module 105 (e.g., a punch hole camera) may be visually exposed. At least a portion of an edge of the region in which the first camera module 105 is exposed may be surrounded by the screen display region 110A and 110D. The first camera module 105 may include a plurality of camera modules (e.g., the camera module 580 in FIG. 5).

The display 106 may be coupled to or disposed adjacent to a touch sensing circuit, a pressure sensor capable of measuring an intensity (a pressure) of a touch, and/or a digitizer that detects a magnetic field-type stylus pen.

The audio modules 103, 104, and 107 may include the microphone holes 103 and 104 and the speaker hole 107.

The microphone hole 103 may be defined in a region of the side surface 110C and the microphone hole 104 may be defined in a region of the second surface 110B. In the microphone holes 103 and 104, a microphone for acquiring an external sound may be disposed. The microphone may include a plurality of microphones to sense a direction of the sound.

The microphone hole 104 defined in the region of the second surface 110B may be disposed adjacent to the camera modules 105, 112, and 113. The microphone hole 104 may acquire sound while using camera modules 105, 112, and 113, or when another function is executed.

The speaker hole 107 may include the external speaker hole 107 and a receiver hole for a call. The external speaker hole 107 may be defined in a portion of the side surface 110C of the electronic device 101. The external speaker hole 107 may be implemented as one hole with the microphone hole 103. Although not shown, a receiver hole for a call may be defined in another portion of the side surface 110C. For example, a receiver hole for a call may be defined in another portion (e.g., a portion on a +Y-axis side) of the side surface 110C facing away from the portion (e.g., a portion on a −Y-axis side) of the side surface 110C in which the external speaker hole 107 is defined.

The electronic device 101 may include a speaker in communication with the speaker hole 107. Alternatively, the speaker may include a piezo speaker in which the speaker hole 107 is omitted.

The sensor module (e.g., the sensor module 576 in FIG. 5) may generate an electrical signal or a data value corresponding to an internal operating state or an external environmental state of the electronic device 101. For example, the sensor module may include at least one of a proximity sensor, a heart rate monitor (HRM) sensor, a fingerprint sensor, a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, and an illuminance sensor.

The camera modules 105, 112, and 113 may include the first camera module 105 (e.g., the punch hole camera) exposed from the first surface 110A of the electronic device 101, and the second camera module 112 and/or the flash 113 exposed through the second surface 110B.

The first camera module 105 may be exposed through a portion of the screen display region 110A and 110D of the display 106. For example, the first camera module 105 may be exposed from a region of the screen display region 110A and 110D through an opening defined in a portion of the display 106.

The second camera module 112 may include a plurality of camera modules (e.g., a dual camera, a triple camera, or a quad camera). However, the second camera module 112 is not limited to including a plurality of camera modules, and may include one camera module.

Each of the first camera module 105 and the second camera module 112 may include one or a plurality of lenses, an image sensor, and/or an image signal processor (ISP). The flash 113 may include a light emitting diode (LED) or a xenon lamp. Two or more lenses (e.g., an IR camera lens and wide-angle and telephoto lens) and image sensors may be disposed on a surface of the electronic device 101.

The key input device 117 may be disposed on the side surface 110C (e.g., in the first regions HOD and/or the second regions 110E) of the housing 110. Alternatively, the electronic device 101 may omit a portion or an entirety of the key input device 117, and the key input device 117 that is not included may be implemented in another form, like a soft key, on the display 106. The key input device may include a sensor module that forms the sensing region included in the screen display region 110A and 110D.

The connector hole 108 may receive a connector. The connector hole 108 may be disposed on the side surface 110C of the housing 110. For example, the connector hole 108 may be disposed on the side surface 110C to be adjacent to at least a portion of the audio module (e.g., the microphone hole 103 and the speaker hole 107). The electronic device 101 may include the first connector hole 108 capable of accommodating a connector (e.g., a universal serial bus (USB) connector) for transmitting/receiving power and/or data with an external device and/or a second connector hole capable of accommodating a connector (e.g., an earphone jack) for transmitting/receiving an audio signal with the external device.

The electronic device 101 may include the light emitting device, e.g., on the first surface 110A of the housing 110. The light emitting device may provide state information of the electronic device 101 using light. The light emitting device may provide a light source for use with the first camera module 105. The light emitting device may include an LED, an IR LED, and/or a xenon lamp.

Figure 1C:
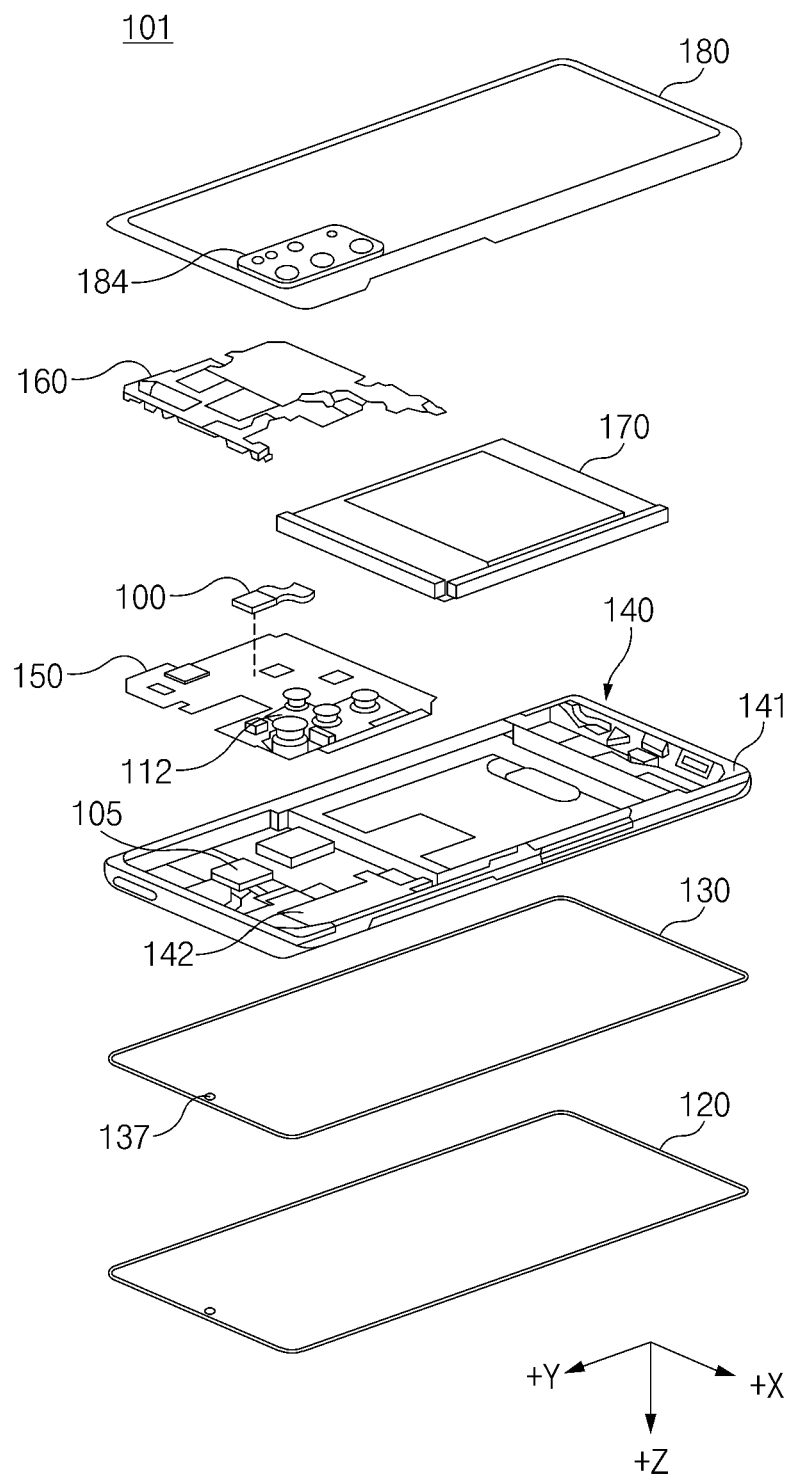
FIG. 1C illustrates an exploded view of an electronic device according to an embodiment.

FIG. 1C illustrates an exploded view of an electronic device according to an embodiment.

Referring to FIG. 1C, the electronic device 101 may include a front surface plate 120 (e.g., the front surface plate 102 in FIG. 1A), a display 130 (e.g., the display 106 in FIG. 1A), a bracket 140, a battery 170, a PCB 150, a RFPCB 100, a support member 160 (e.g., a rear casing), and a rear surface plate 180 (e.g., the rear surface plate 111 in FIG. 1B).

Alternatively, the electronic device 101 may omit at least one of the components (e.g., the support member 160) or include additional components.

The front surface plate 120, the rear surface plate 180, and/or the bracket 140 (e.g., a frame structure 141) may form a housing (e.g., the housing 110 in FIGS. 1A and 1B).

The bracket 140 may include the frame structure 141 that forms a surface of the electronic device 101 (e.g., a portion of the side surface 110C in FIG. 1A) and a plate structure 142 that extends inwardly of the electronic device 101 from the frame structure 141.

The plate structure 142 may be located inside the electronic device 101, connected to the frame structure 141, or integrally formed with the frame structure 141. The plate structure 142 may be made of a metallic material and/or a non-metallic (e.g., polymer) material. The display 130 may be coupled to a surface of the plate structure 142 and the PCB 150 may be coupled to the other surface of the plate structure 142. A processor, a memory, and/or an interface may be mounted on the PCB 150. The processor may include one or more of a central processing unit (CPU), an application processor (AP), a graphics processing unit (GPU), an ISP, a sensor hub processor, and a communication processor (CP).

The memory may include a volatile memory and/or a non-volatile memory.

The interface may include a high-definition multimedia interface (HDMI), a USB interface, a secure digital (SD) card interface, and/or an audio interface. The interface may electrically or physically connect the electronic device 101 to an external device, and may include a USB connector, an SD card/multimedia card (MMC) connector, or an audio connector.

The RFPCB 100 may be disposed on a surface (e.g., a surface directed in a −Z direction) of the PCB 150. One end (e.g., a rigid portion 10 in FIG. 2A) of the RFPCB 100 may be disposed on the PCB 150, and the other end of the RFPCB 100 may be connected to another component (e.g., the second camera module 112 or a PCB, different from the PCB 150 or) of the electronic device 101 to electrically connect the PCB 150 and another component. Unlike the illustration, the RFPCB 100 may be disposed on the other surface (e.g., a surface directed in a +Z direction) of the PCB 150.

The battery 170 may supply power to at least one of the components of the electronic device 101. The battery 170 may include a non-rechargeable primary cell, a rechargeable secondary cell, or a fuel cell. At least a portion of the battery 170 may be disposed substantially coplanar with the PCB 150. The battery 170 may be integrally disposed inside the electronic device 101 or may be disposed detachably from the electronic device 101.

The first camera module 105 may be disposed on the plate structure 142 of the bracket 140 such that the lens thereof is exposed from a region of the front surface plate 120 (e.g., the front surface 110A in FIG. 1A) of the electronic device 101.

The first camera module 105 may be disposed such that an optical axis of the lens thereof is at least partially aligned with a hole or recess 137 defined in the display 130. For example, the region from which the lens is exposed may be formed on the front surface plate 120. The first camera module 105 may include the punch hole camera having at least a portion disposed inside the hole or recess 137 defined in a rear surface of the display 130.

The second camera module 112 may be disposed on the PCB 150 such that the lens thereof is exposed from a camera region 184 of the rear surface plate 180 (e.g., the rear surface 110B in FIG. 1B) of the electronic device 101.

The camera region 184 may be formed on a surface (e.g., the rear surface 110B in FIG. 1B) of the rear surface plate 180. The camera region 184 may be formed to be at least partially transparent such that external light is incident to the lens of the second camera module 112. At least a portion of the camera region 184 may protrude from the surface of the rear surface plate 180 with a predetermined height. However, the disclosure is not limited thereto, and the camera region 184 may be substantially coplanar with the surface of the rear surface plate 180.

Figure 2A:
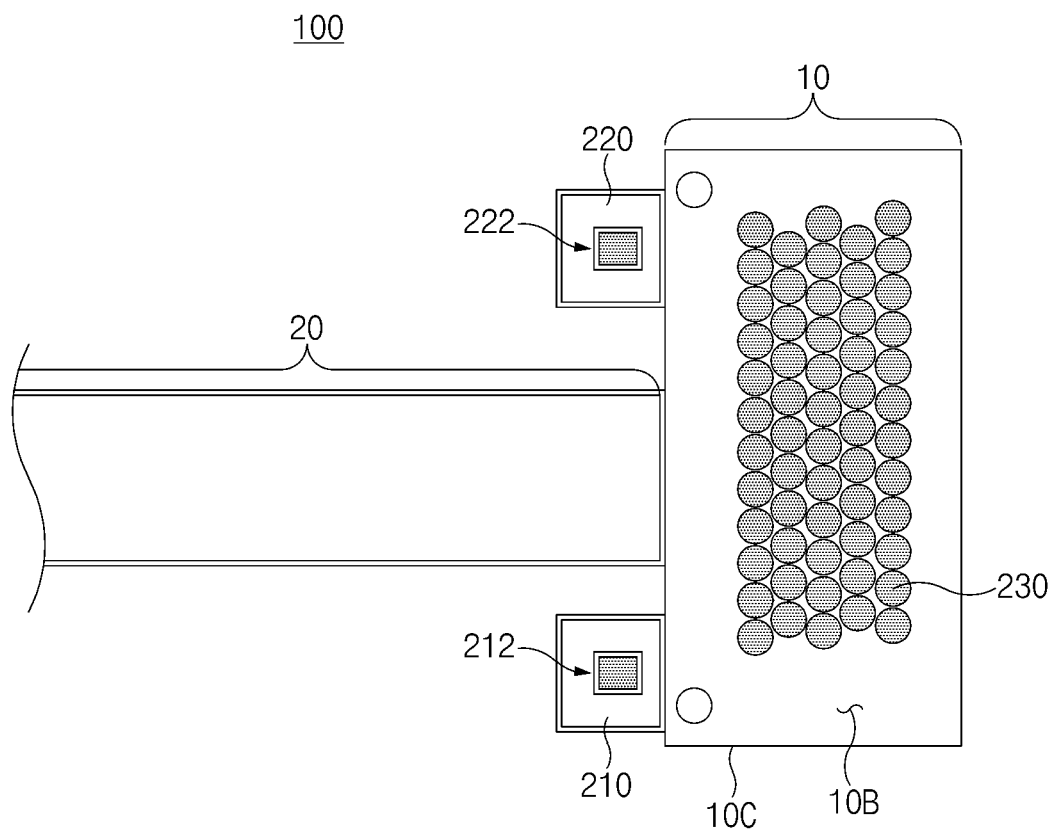
FIG. 2A illustrates an RFPCB according to an embodiment.

FIG. 2A illustrates an RFPCB according to an embodiment. For example, FIG. 2A may illustrate a view of the RFPCB 100 in FIG. 1C when viewed in the −Z direction.

Figure 2B:
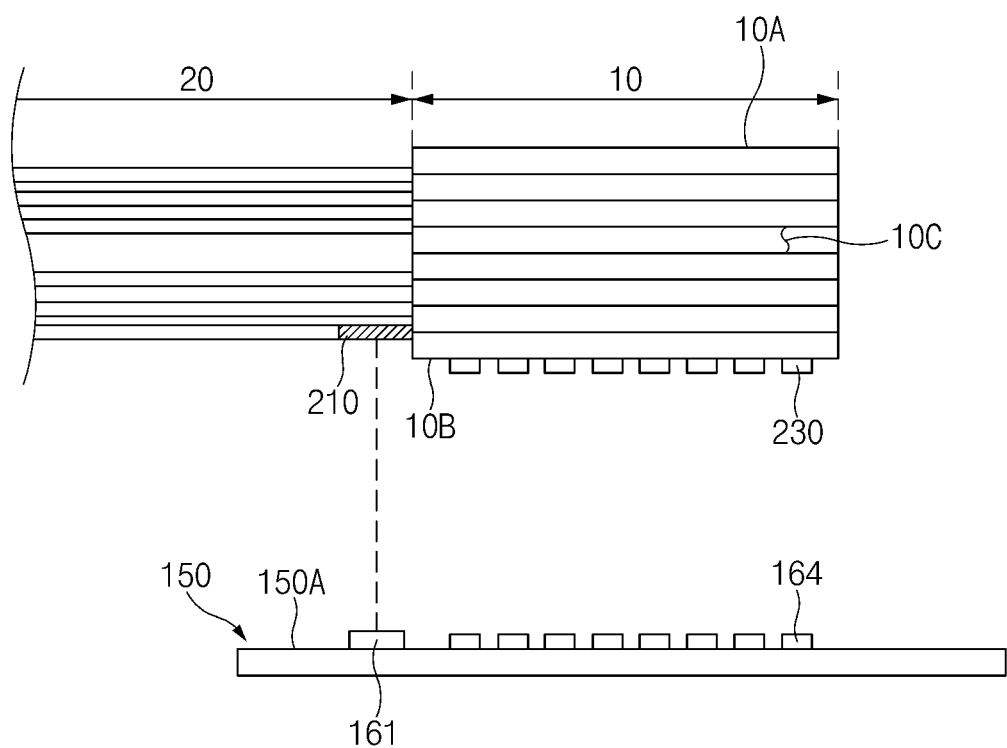
FIG. 2B illustrates a side view of an RFPCB according to an embodiment.

FIG. 2B illustrates a side view of an RFPCB according to an embodiment.

Figure 2C:
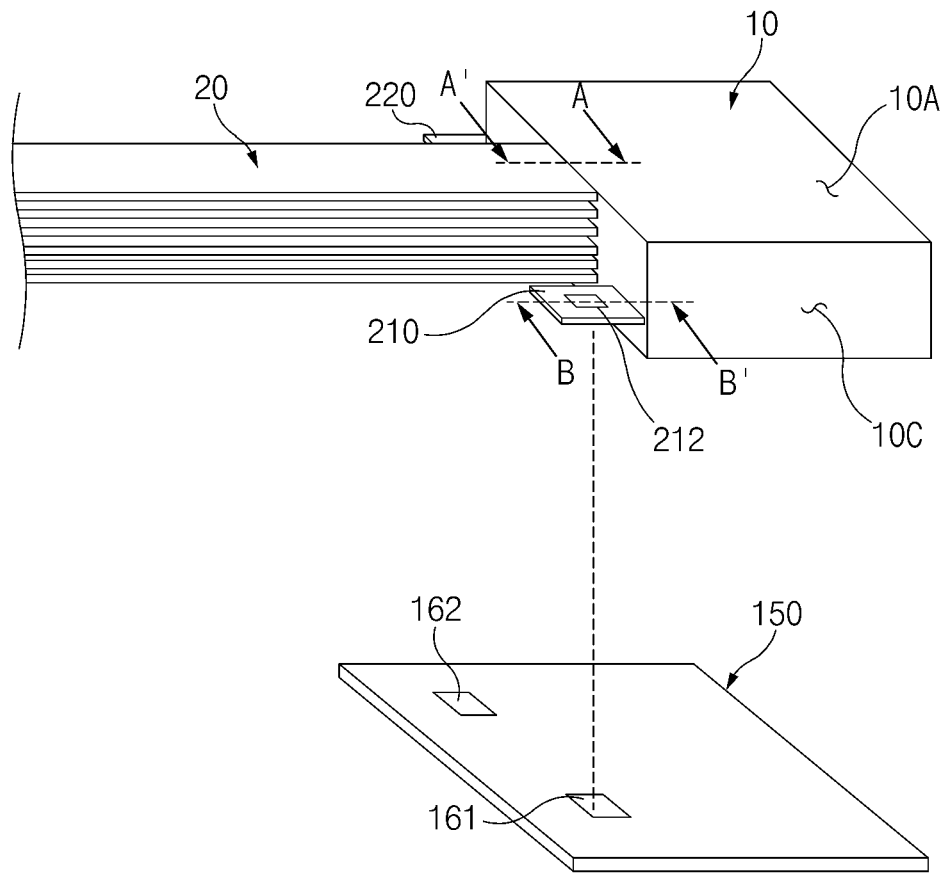
FIG. 2C illustrates a perspective view of an RFPCB according to an embodiment.

FIG. 2C illustrates a perspective view of an RFPCB according to an embodiment.

Referring to FIGS. 2A, 2B, and 2C, the RFPCB 100 may include a rigid portion 10, a flexible portion 20, a first protrusion 210, and a second protrusion 220.

The rigid portion 10 may include a top surface 10A, a bottom surface 10B substantially parallel to the top surface 10A, and a side surface 10C extending from an edge of the top surface 10A to an edge of the bottom surface 10B. The RFPCB 100 may be disposed such that the bottom surface 10B of the rigid portion 10 faces the PCB 150.

The rigid portion 10 may include pads 230 formed on the bottom surface 10B. The pads 230 of the rigid portion 10 may be bonded to pads 164 formed on a first surface 150A of the PCB 150, e.g., by a hot bar scheme.

The flexible portion 20 may extend from the rigid portion 10. For example, the flexible portion 20 may extend from the side surface 10C of the rigid portion 10.

The first protrusion 210 and the second protrusion 220 may protrude from the rigid portion 10. the first protrusion 210 and the second protrusion 220 may protrude from the side surface 10C of the rigid portion 10. The first protrusion 210 and the second protrusion 220 may be spaced apart from each other. The first protrusion 210 and the second protrusion 220 may be substantially parallel to PCB 150.

A first alignment mark 212 and a second alignment mark 222 may be defined in the first protrusion 210 and the second protrusion 220, respectively. The first alignment mark 212 and the second alignment mark 222 may be substantially transparent or semi-transparent. The first protrusion 210 and the second protrusion 220 may at least partially overlap an alignment mark formed on the first surface 150A of the PCB 150. For example, the first protrusion 210 may at least partially overlap a third alignment mark 161 of the PCB 150, and the second protrusion 220 may at least partially overlap a fourth alignment mark 162 of the PCB 150. The RFPCB 100 may be accurately positioned on the PCB 150 by identifying the third alignment mark 161 and the fourth alignment mark 162 of the PCB 150 respectively located below the first alignment mark 212 and the second alignment mark 222 through the substantially transparent or semi-transparent first alignment mark 212 and second alignment mark 222 of the RFPCB 100. Each of the third alignment mark 161 and the fourth alignment mark 162 of the PCB 150 may include a conductive pad exposed through the first surface 150A, but the disclosure is not limited thereto. For example, the third alignment mark 161 and the fourth alignment mark 162 may include various marks (e.g., a laser mark, a printed mark, or a mark formed through drilling) that may be identified through vision inspection.

The flexible portion 20 may be located between the first protrusion 210 and the second protrusion 220.

Although FIGS. 2A, 2B, and 2C illustrate the first protrusion 210, the second protrusion 220, and the flexible portion 20 as extending from one edge of the side surface 10C of the rigid portion 10, the disclosure is not limited thereto. The first protrusion 210, the second protrusion 220, and the flexible portion 20 may extend from different edges. Further, when the rigid portion 10 has a hexahedral shape, the side surface 10C of the rigid portion 10 may include four edges.

Figure 3:
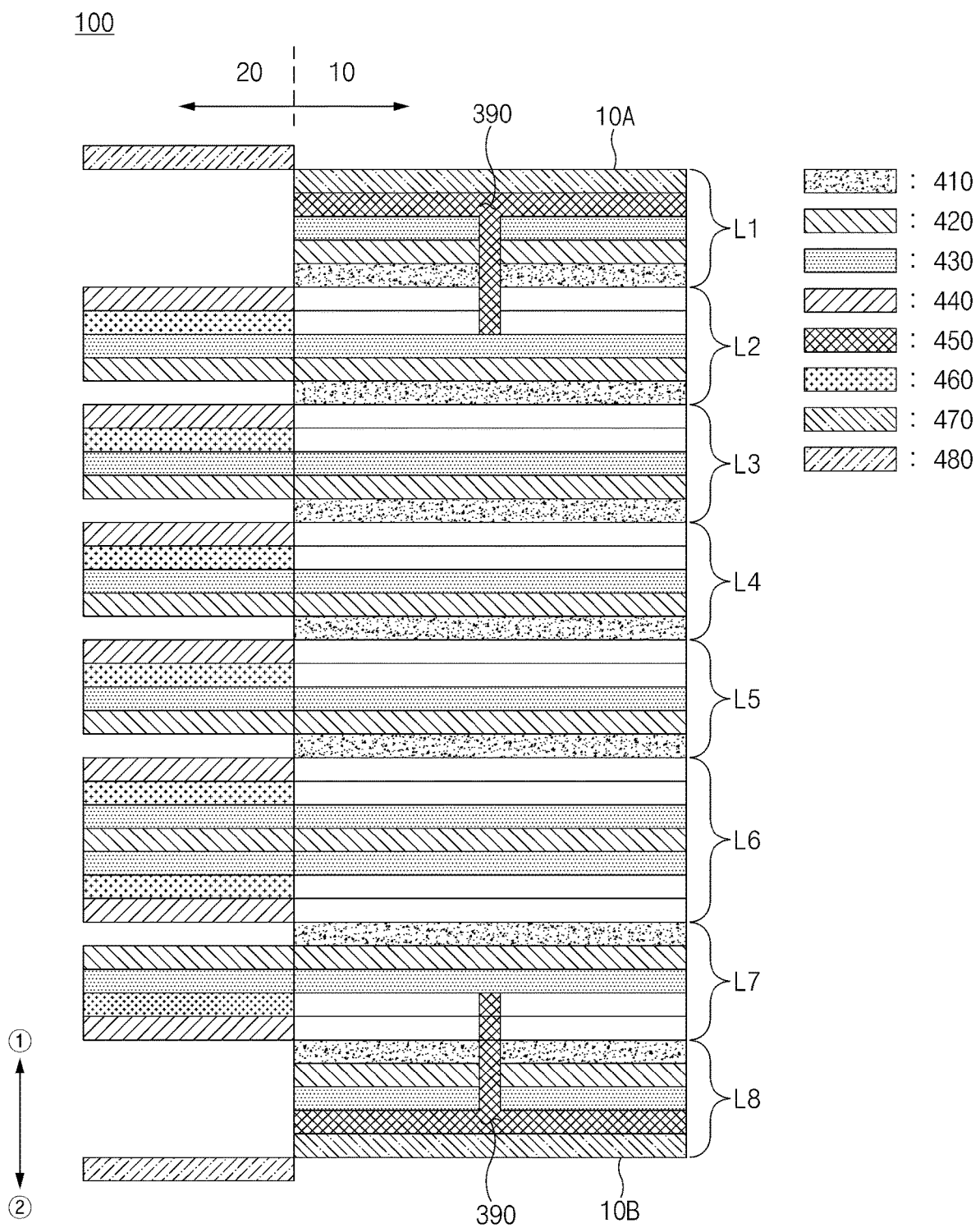
FIG. 3 illustrates a cross-sectional view taken along line A-A' in FIG. 2C according to an embodiment.

FIG. 3 illustrates a cross-sectional view taken along line A-A' in FIG. 2C according to an embodiment. For example, FIG. 3 may be a conceptual diagram of a stacked structure corresponding to line A-A' in FIG. 2C.

Referring to FIG. 3, the RFPCB 100 may include a plurality of layers. For example, the rigid portion 10 of the RFPCB 100 may include first to eighth layers L1 to L8, and the flexible portion 20 of the RFPCB 100 may include second to seventh layers L2 to L7. The second to seventh layers L2 to L7 of the flexible portion 20 may extend inwardly of the rigid portion 10.

The RFPCB 100 may include a rigid insulating layer 410, a flexible film layer 420, a conductive layer 430, a plating layer 450, a protective layer 470, a cover layer (or a coverlay or a coverlay film) 440, an adhesive layer 460, and a shielding layer 480.

The rigid insulating layer 410 may be repeatedly stacked in the first to eighth layers L1 to L8 of the rigid portion 10. The rigid insulating layer 410 may contain a hardened prepreg, but the disclosure is not limited thereto.

The flexible film layer 420 may be repeatedly stacked in the flexible portion 20 and the first to eighth layers L1 to L8 of the rigid portion 10. The flexible film layer 420 may contain polyimide, but the disclosure is not limited thereto.

The conductive layer 430 may be formed on the flexible film layer 420. The conductive layer 430 of the sixth layer L6 may be formed on each of both surfaces of the flexible film layer 420. The conductive layer 430 of the first to fifth layers L1 to L5, the seventh layer L7, and the eighth layer L8 may be formed on a surface of the flexible film layer 420.

In the rigid portion 10, the flexible film layer 420 and the conductive layer 430 corresponding to layers adjacent to each other, may be disposed with the rigid insulating layer 410 interposed therebetween. For example, the flexible film layer 420 and the conductive layer 430 of the second layer L2 may be sequentially disposed on a surface (e.g., a surface directed in a direction ①) of the rigid insulating layer 410 of the second layer L2, and the conductive layer 430 and the flexible film layer 420 of the third layer L3 may be sequentially disposed on the other surface (e.g., a surface directed in a direction ②) of the rigid insulating layer 410 of the second layer L2.

The conductive layer 430 may form a circuit pattern of the RFPCB 100. The conductive layer 430 may contain copper, but the disclosure is not limited thereto. For example, the conductive layer 430 may contain a conductive metal capable of transmitting an electrical signal.

The plating layer 450 may be formed on the conductive layer 430 of the first layer L1 and the conductive layer 430 of the eighth layer L8. The plating layer 450 may contain copper, but the disclosure is not limited thereto. For example, the plating layer 450 may contain a conductive metal capable of transmitting an electrical signal.

The RFPCB 100 may include a conductive via for electrically connecting the conductive layers 430 disposed on different layers. For example, a micro via 390 and/or a through via 490 that conduct (or penetrate) at least two layers may be defined in the rigid portion 10 of the RFPCB 100. The plating layer 450 may be at least partially filled in the micro via 390 and/or the through via 490, so that the conductive layers 430 of the different layers may be electrically connected to each other.

The protective layer 470 may be formed on the plating layer 450. The protective layer 470 may contain a solder resist. The protective layer 470 may cover the conductive layer 430 and the plating layer 450, thereby protecting them from an external environment. Portions of the conductive layer 430 and the plating layer 450 may not be covered by the protective layer 470 and be exposed to the outside to form pads (e.g., the pads 230 in FIG. 2A) electrically connected to the PCB 150.

The cover layer 440 may be disposed on the flexible film layer 420 to cover the conductive layer 430 of the flexible portion 20. The cover layer 440 may be attached to the flexible film layer 420 through the adhesive layer 460 interposed between the flexible film layer 420 and the cover layer 440. The cover layer 440 may cover the conductive layer 430 of the flexible portion 20, thereby protecting the conductive layer 430 from the external environment. The cover layer 440 may contain polyimide, but the disclosure is not limited thereto.

The adhesive layer 460 may contain an adhesive containing an epoxy-based resin, but the disclosure is not limited thereto.

The shielding layer 480 may be disposed outwardly of the flexible portion 20 so as to at least partially surround the flexible portion 20. For example, the shielding layer 480 may be disposed above (e.g., a direction Q) the second layer L2 of the flexible portion 20 and below (e.g., a direction @) the seventh layer L7. The shielding layer 480 may shield an electromagnetic wave that may be transmitted to electronic components (or from the electronic components) located around the RFPCB 100. The shielding layer 480 may contain a film including a conductive metal layer, but the disclosure is not limited thereto.

The stacked structure of the RFPCB 100 in FIG. 3 is exemplary, and various design changes are able to be made. For example, although the sixth layer L6 in FIG. 3 is illustrated as having the conductive layers 430 respectively formed on both surfaces of the flexible film layer 420, the conductive layer 430 may be formed on only one surface of the flexible film layer 420. As another example, although some layers in FIG. 3 (e.g., the second layer L2) are shown as having the flexible film layer 420 with the conductive layer 430 formed on only one surface thereof, at least one of the layers may include the flexible film layer 420 having the conductive layers 430 respectively formed on both surfaces thereof. As another example, although FIG. 3 illustrates the rigid portion 10 of the RFPCB 100 including the 8 layers and the flexible portion 20 of the RFPCB 100 including the 6 layers, the number of layers included in each of the rigid portion 10 and the flexible portion 20 may be less or more than the number in the illustrated example.

Figure 4:
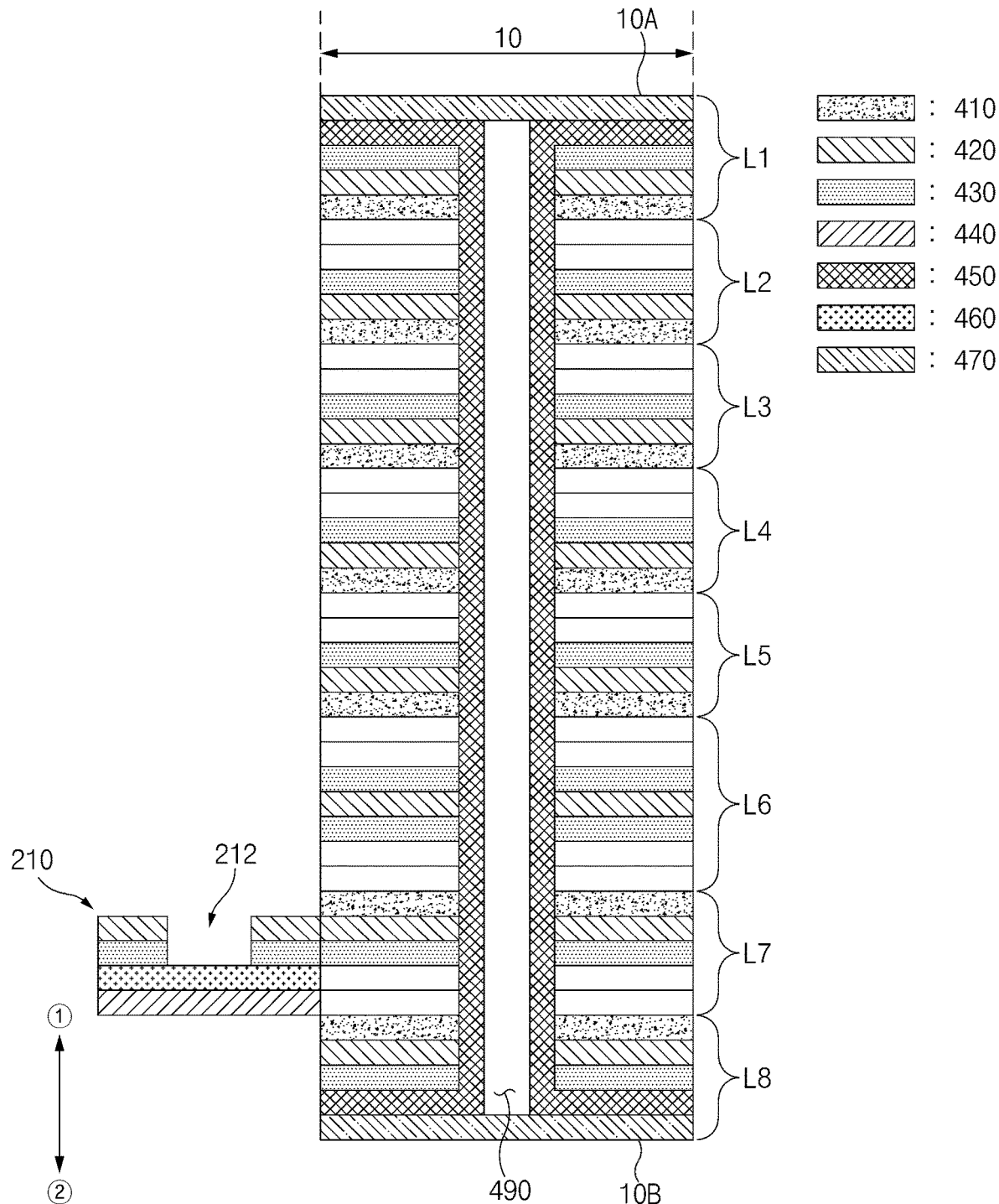
FIG. 4 illustrates a cross-sectional view taken along line B-B' in FIG. 2C according to an embodiment.

FIG. 4 illustrates a cross-sectional view taken along line B-B' in FIG. 2C according to an embodiment. For example, FIG. 4 may be a conceptual diagram of a stacked structure corresponding to line B-B' in FIG. 2C. In describing FIG. 4, redundant descriptions of components having the same reference numerals as those described above will be omitted.

Referring to FIG. 4, the first protrusion 210 may protrude from the rigid portion 10. The first protrusion 210 may be formed by extending from one of the plurality of layers of the rigid portion 10. The first protrusion 210 may be formed by extending from the seventh layer L7 of the rigid portion 10, but the disclosure is not limited by the above-described example. As another example, the first protrusion 210 may extend from the sixth layer L6 of the rigid portion 10.

The first alignment mark 212 may be defined in the first protrusion 210. The first alignment mark 212 may be defined by partially removing the flexible film layer 420 and the conductive layer 430 of the first protrusion 210. The first alignment mark 212 may include an opening partially penetrating the first protrusion 210. In a region corresponding to the first alignment mark 212 in the first protrusion 210, the flexible film layer 420 and the conductive layer 430 may not be disposed. The first alignment mark 212 with only the cover layer 440 left as the flexible film layer 420 and the conductive layer 430 removed may be substantially transparent or semi-transparent, and the alignment mark (e.g., the third alignment mark 161 in FIG. 2B) of the PCB 150 may be identified through the first alignment mark 212 of the RFPCB 100.

The division of the layers illustrated in FIGS. 3 and 4 is provided for convenience of description. The layers of the RFPCB 100 may be divided or referred to based on various criteria. For example, each of the rigid insulating layer 410, the flexible film layer 420, the conductive layer 430, and the cover layer 440 included in the RFPCB 100 may be referred to as one layer. In this case, it may be understood that the first protrusion 210 is formed as some (e.g., the flexible film layer 420, the conductive layer 430, the adhesive layer 460, and the cover layer 440 corresponding to the seventh layer L7) of the plurality of layers included in the RFPCB 100 protrude from the rigid portion 10.

The description of the first protrusion 210 and the first alignment mark 212 above may be applied to the second protrusion 220 and the second alignment mark 222, in a substantially the same, similar, or corresponding scheme.

The RFPCB 100 including the first protrusion 210 and the second protrusion 220 of the RFPCB 100 may be manufactured as follows.

The layers (e.g., the first to eighth layers L1 to L8 may be stacked, and then, punched depending on an outer shape thereof including the protrusions. Because the protrusions are formed on all the layers, protrusions of the remaining layers except for a layer (e.g., the seventh layer L7) requiring the protrusion may be removed through laser processing or the like. However, the disclosure is not limited by the above-described example.

Although FIGS. 3 and 4 illustrate the rigid insulating layer 410 of each of layers (e.g., the second layer L2) and the conductive layer 430 of each of neighboring layers (e.g., the third layer L3) are spaced apart from each other with a region marked with a blank interposed therebetween, this is for convenience of description, and the rigid insulating layer 410 may be at least partially disposed in the blank region.

As described above, according to an embodiment, an electronic device (e.g., the electronic device 101 in FIG. 1A) may include a PCB (e.g., the PCB 150 in FIG. 2C) having a first alignment mark (e.g., the third alignment mark 161 in FIG. 2C) formed on a first surface (e.g., the first surface 150A in FIG. 2B) of the PCB, and an RFPCB (e.g., the RFPCB 100 in FIG. 2A) including a plurality of layers, the RFPCB may include a rigid portion (e.g., the rigid portion 10 in FIG. 2B) disposed on the first surface of the PCB, a flexible portion (e.g., the flexible portion 20 in FIG. 2B) extending from the rigid portion, and a first protrusion (e.g., the first protrusion 210 in FIG. 2C) formed as one (e.g., the seventh layer L7 in FIG. 4) of the plurality of layers protruding and extending from the rigid portion, a second alignment mark (e.g., the first alignment mark 212 in FIG. 2C) corresponding to the first alignment mark of the PCB may be defined in the first protrusion, and the first protrusion may overlap at least partially with the first alignment mark of the PCB.

A third alignment mark (e.g., the fourth alignment mark 162 in FIG. 2C) may be formed on the first surface of the PCB, the RFPCB may include a second protrusion (e.g., the second protrusion 220 in FIG. 2A) spaced apart from the first protrusion, and formed as the one of the plurality of layers protruding and extending from the rigid portion, and the second protrusion having a fourth alignment mark (e.g., the second alignment mark 222 in FIG. 2A) defined in the second protrusion may overlap at least partially with the third alignment mark of the PCB.

The flexible portion may extend from the rigid portion at a location between the first protrusion and the second protrusion.

The one layer of the RFPCB may include a first flexible film layer (e.g., the flexible film layer 420 of the seventh layer L7 in FIG. 3), a first conductive layer (e.g., the conductive layer 430 of the seventh layer L7 in FIG. 3) formed on the first flexible film layer; and a first cover layer (e.g., the cover lay 440 of the seventh layer L7 in FIG. 3) for covering the first conductive layer in the flexible portion.

The RFPCB may include a second flexible film layer (e.g., the flexible film layer 420 of the sixth layer L6 in FIG. 3), a second conductive layer (e.g., the conductive layer 430 of the sixth layer L6 in FIG. 3) formed on the second flexible film layer, a second cover layer (e.g., the cover lay 440 of the sixth layer L6 in FIG. 3) for covering the second conductive layer in the flexible portion, and a rigid insulating layer (e.g., the rigid insulating layer 410 of the sixth layer L6 in FIG. 3) disposed between the first flexible film layer and the second conductive layer in the rigid portion.

The electronic device may further include a conductive via (e.g., the micro via 390 in FIG. 3 or the through via 490 in FIG. 4) at least partially penetrating the rigid portion such that the first conductive layer and the second conductive layer are electrically connected to each other.

The first flexible film layer may contain polyimide, the first conductive layer may contain copper, the first cover layer may contain polyimide, and the rigid insulating layer may contain a prepreg.

The electronic device may further include an adhesive layer (e.g., the adhesive layer 460 in FIG. 3) interposed between the first conductive layer and the first cover layer.

The electronic device may further include a shielding layer (e.g., the shielding layer 480 in FIG. 3) for at least partially surrounding the flexible portion.

The first protrusion may be formed as the first flexible film layer, the first conductive layer, and the first cover layer protruding and extending from the rigid portion.

The second alignment mark of the first protrusion may include an opening defined by removing the first flexible film layer and the first conductive layer.

The PCB may include first conductive pads (e.g., the pads 164 in FIG. 2B) formed on the first surface, and the RFPCB may include second conductive pads (the pads 230 in FIG. 2B) formed on a surface (e.g., the bottom surface 10B in FIG. 2B) of the rigid portion and bonded to the first conductive pads.

The first conductive pads and the second conductive pads may be bonded together by a hot bar process.

The rigid portion may include a top surface (the top surface 10A in FIG. 2B), a bottom surface (e.g., the bottom surface 10B in FIG. 2B) substantially parallel to the top surface and facing the PCB, and a side surface (e.g., the side surface 10C in FIG. 2B) extending from an edge of the top surface to an edge of the bottom surface, and the first protrusion may protrude from the side surface of the rigid portion.

The first alignment mark of the PCB may include a conductive pad exposed through the first surface.

As described above, an RFPCB (e.g., the RFPCB 100 in FIG. 2A) according to an embodiment may include a plurality of layers bonded to a PCB (e.g., the PCB 150 in FIG. 2B), a rigid portion (e.g., the rigid portion 10 in FIG. 2B) disposed on a first surface of the PCB, a flexible portion (e.g., the flexible portion 20 in FIG. 2B) extending from the rigid portion, and a first protrusion (e.g., the first protrusion 210 in FIG. 4) formed as one (the seventh layer L7 in FIG. 4) of the plurality of layers protruding and extending from the rigid portion, a second alignment mark (e.g., the first alignment mark 212 in FIG. 4) corresponding to a first alignment mark (e.g., the third alignment mark 161 in FIG. 2C) formed on the first surface of the PCB defined in the first protrusion, and the first protrusion may overlap at least partially with the first alignment mark of the PCB.

The RFPCB may include a second protrusion (e.g., the second protrusion 220 in FIG. 2A) spaced apart from the first protrusion, and formed as the one of the plurality of layers protruding and extending from the rigid portion, a fourth alignment mark (e.g., the second alignment mark 222 in FIG. 2A) corresponding to a third alignment mark (e.g., the fourth alignment mark 162 in FIG. 2C) formed on the first surface of the PCB may be defined in the second protrusion, and the second protrusion may overlap at least partially with the third alignment mark of the PCB.

The flexible portion may extend from the rigid portion at a location between the first protrusion and the second protrusion.

The one of the plurality of layers may include a first flexible film layer (e.g., the flexible film layer 420 in FIG. 4), a first conductive layer (e.g., the conductive layer 430 in FIG. 4) formed on the first flexible film layer, a first cover layer (e.g., the cover lay 440 in FIG. 4) for covering the first conductive layer in the flexible portion, and an adhesive layer (e.g., the adhesive layer 460 in FIG. 4) interposed between the first conductive layer and the first cover layer.

The first protrusion may be formed as the first flexible film layer, the first conductive layer, the adhesive layer, and the first cover layer protruding and extending from the rigid portion, and the second alignment mark of the first protrusion may include an opening defined by removing the first flexible film layer and the first conductive layer.

FIG. 5 illustrates an electronic device 501 in a network environment 500 according to an embodiment.

Referring to FIG. 5, the electronic device 501 in the network environment 500 may communicate with an electronic device 502 via a first network 598 (e.g., a short-range wireless communication network), or at least one of an electronic device 504 or a server 508 via a second network 599 (e.g., a long-range wireless communication network). According to an embodiment, the electronic device 501 may communicate with the electronic device 504 via the server 508. According to an embodiment, the electronic device 501 may include a processor 520, memory 530, an input module 550, a sound output module 555, a display module 560, an audio module 570, a sensor module 576, an interface 577, a connecting terminal 578, a haptic module 579, a camera module 580, a power management module 588, a battery 589, a communication module 590, a subscriber identification module (SIM) 596, or an antenna module 597. In some embodiments, at least one of the components (e.g., the connecting terminal 578) may be omitted from the electronic device 501, or one or more other components may be added in the electronic device 501. In some embodiments, some of the components (e.g., the sensor module 576, the camera module 580, or the antenna module 597) may be implemented as a single component (e.g., the display module 560).

The processor 520 may execute, for example, software (e.g., a program 540) to control at least one other component (e.g., a hardware or software component) of the electronic device 501 coupled with the processor 520, and may perform various data processing or computation. According to one embodiment, as at least part of the data processing or computation, the processor 520 may store a command or data received from another component (e.g., the sensor module 576 or the communication module 590) in volatile memory 532, process the command or the data stored in the volatile memory 532, and store resulting data in non-volatile memory 534. According to an embodiment, the processor 520 may include a main processor 521 (e.g., a CPU or an AP), or an auxiliary processor 523 (e.g., a GPU, a neural processing unit (NPU), an ISP, a sensor hub processor, or a CP) that is operable independently from, or in conjunction with, the main processor 521. For example, when the electronic device 501 includes the main processor 521 and the auxiliary processor 523, the auxiliary processor 523 may be adapted to consume less power than the main processor 521, or to be specific to a specified function. The auxiliary processor 523 may be implemented as separate from, or as part of the main processor 521.

The auxiliary processor 523 may control at least some of functions or states related to at least one component (e.g., the display module 560, the sensor module 576, or the communication module 590) among the components of the electronic device 501, instead of the main processor 521 while the main processor 521 is in an inactive (e.g., sleep) state, or together with the main processor 521 while the main processor 521 is in an active state (e.g., executing an application). According to an embodiment, the auxiliary processor 523 (e.g., an ISP or a CP) may be implemented as part of another component (e.g., the camera module 580 or the communication module 590) functionally related to the auxiliary processor 523. According to an embodiment, the auxiliary processor 523 (e.g., the NPU) may include a hardware structure specified for artificial intelligence model processing. An artificial intelligence model may be generated by machine learning. Such learning may be performed, e.g., by the electronic device 501 where the artificial intelligence is performed or via a separate server (e.g., the server 508). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent DNN (BRDNN), deep Q-network or a combination of two or more thereof but is not limited thereto. The artificial intelligence model may, additionally or alternatively, include a software structure other than the hardware structure.

The memory 530 may store various data used by at least one component (e.g., the processor 520 or the sensor module 576) of the electronic device 501. The various data may include, for example, software (e.g., the program 540) and input data or output data for a command related thereto. The memory 530 may include the volatile memory 532 or the non-volatile memory 534.

The program 540 may be stored in the memory 530 as software, and may include, for example, an operating system (OS) 542, middleware 544, or an application 546.

The input module 550 may receive a command or data to be used by another component (e.g., the processor 520) of the electronic device 501, from the outside (e.g., a user) of the electronic device 501. The input module 550 may include, for example, a microphone, a mouse, a keyboard, a key (e.g., a button), or a digital pen (e.g., a stylus pen).

The sound output module 555 may output sound signals to the outside of the electronic device 501. The sound output module 555 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 560 may visually provide information to the outside (e.g., a user) of the electronic device 501. The display module 560 may include, for example, a display, a hologram device, or a projector and control circuitry to control a corresponding one of the display, hologram device, and projector. According to an embodiment, the display module 560 may include a touch sensor adapted to detect a touch, or a pressure sensor adapted to measure the intensity of force incurred by the touch.

The audio module 570 may convert a sound into an electrical signal and vice versa. According to an embodiment, the audio module 570 may obtain the sound via the input module 550, or output the sound via the sound output module 555 or a headphone of an external electronic device (e.g., an electronic device 502) directly (e.g., wiredly) or wirelessly coupled with the electronic device 501.

The sensor module 576 may detect an operational state (e.g., power or temperature) of the electronic device 501 or an environmental state (e.g., a state of a user) external to the electronic device 501, and then generate an electrical signal or data value corresponding to the detected state. According to an embodiment, the sensor module 576 may include, for example, a gesture sensor, a gyro sensor, an atmospheric pressure sensor, a magnetic sensor, an acceleration sensor, a grip sensor, a proximity sensor, a color sensor, an IR sensor, a biometric sensor, a temperature sensor, a humidity sensor, or an illuminance sensor.

The interface 577 may support one or more specified protocols to be used for the electronic device 501 to be coupled with the external electronic device (e.g., the electronic device 502) directly (e.g., wiredly) or wirelessly. According to an embodiment, the interface 577 may include, for example, an HDMI, a USB interface, an SD card interface, or an audio interface.

A connecting terminal 578 may include a connector via which the electronic device 501 may be physically connected with the external electronic device (e.g., the electronic device 502). According to an embodiment, the connecting terminal 578 may include, for example, an HDMI connector, a USB connector, an SD card connector, or an audio connector (e.g., a headphone connector).

The haptic module 579 may convert an electrical signal into a mechanical stimulus (e.g., a vibration or a movement) or electrical stimulus which may be recognized by a user via his tactile sensation or kinesthetic sensation. According to an embodiment, the haptic module 579 may include, for example, a motor, a piezoelectric element, or an electric stimulator.

The camera module 580 may capture a still image or moving images. According to an embodiment, the camera module 580 may include one or more lenses, image sensors, ISPs, or flashes.

The power management module 588 may manage power supplied to the electronic device 501. According to one embodiment, the power management module 588 may be implemented as at least part of, for example, a power management integrated circuit (PMIC).

The battery 589 may supply power to at least one component of the electronic device 501. According to an embodiment, the battery 589 may include, for example, a primary cell which is not rechargeable, a secondary cell which is rechargeable, or a fuel cell.

The communication module 590 may support establishing a direct (e.g., wired) communication channel or a wireless communication channel between the electronic device 501 and the external electronic device (e.g., the electronic device 502, the electronic device 504, or the server 508) and performing communication via the established communication channel. The communication module 590 may include one or more CPs that are operable independently from the processor 520 (e.g., the AP) and supports a direct (e.g., wired) communication or a wireless communication. According to an embodiment, the communication module 590 may include a wireless communication module 592 (e.g., a cellular communication module, a short-range wireless communication module, or a global navigation satellite system (GNSS) communication module) or a wired communication module 594 (e.g., a local area network (LAN) communication module or a power line communication (PLC) module). A corresponding one of these communication modules may communicate with the external electronic device via the first network 598 (e.g., a short-range communication network, such as Bluetooth™, wireless-fidelity (Wi-Fi) direct, or IR data association (IrDA)) or the second network 599 (e.g., a long-range communication network, such as a legacy cellular network, a $5^{th}$ generation (5G) network, a next-generation communication network, the Internet, or a computer network (e.g., LAN or wide area network (WAN))). These various types of communication modules may be implemented as a single component (e.g., a single chip), or may be implemented as multi components (e.g., multi chips) separate from each other. The wireless communication module 592 may identify and authenticate the electronic device 501 in a communication network, such as the first network 598 or the second network 599, using subscriber information (e.g., international mobile subscriber identity (IMSI)) stored in the SIM 596.

The wireless communication module 592 may support a 5G network, after a $4^{th}$ generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 592 may support a high-frequency band (e.g., the mmWave band) to achieve, e.g., a high data transmission rate. The wireless communication module 592 may support various technologies for securing performance on a high-frequency band, such as, e.g., beamforming, massive multiple-input and multiple-output (MIMO), full dimensional MIMO (FD-MIMO), array antenna, analog beam-forming, or large scale antenna. The wireless communication module 592 may support various requirements specified in the electronic device 501, an external electronic device (e.g., the electronic device 504), or a network system (e.g., the second network 599). According to an embodiment, the wireless communication module 592 may support a peak data rate (e.g., 20 Gbps or more) for implementing eMBB, loss coverage (e.g., 564 dB or less) for implementing mMTC, or U-plane latency (e.g., 0.5 ms or less for each of downlink (DL) and uplink (UL), or a round trip of 5 ms or less) for implementing URLLC.

The antenna module 597 may transmit or receive a signal or power to or from the outside (e.g., the external electronic device) of the electronic device 501. According to an embodiment, the antenna module 597 may include an antenna including a radiating element composed of a conductive material or a conductive pattern formed in or on a substrate (e.g., a PCB). According to an embodiment, the antenna module 597 may include a plurality of antennas (e.g., array antennas). In such a case, at least one antenna appropriate for a communication scheme used in the communication network, such as the first network 598 or the second network 599, may be selected, for example, by the communication module 590 (e.g., the wireless communication module 592) from the plurality of antennas. The signal or the power may then be transmitted or received between the communication module 590 and the external electronic device via the selected at least one antenna. According to an embodiment, another component (e.g., a radio frequency integrated circuit (RFIC)) other than the radiating element may be additionally formed as part of the antenna module 597.

According to various embodiments, the antenna module 597 may form a mmWave antenna module. According to an embodiment, the mmWave antenna module may include a PCB, an RFIC disposed on a first surface (e.g., the bottom surface) of the PCB, or adjacent to the first surface and capable of supporting a designated high-frequency band (e.g., the mmWave band), and a plurality of antennas (e.g., array antennas) disposed on a second surface (e.g., the top or a side surface) of the PCB, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 501 and the external electronic device 504 via the server 508 coupled with the second network 599. Each of the electronic devices 502 or 504 may be a device of a same type as, or a different type, from the electronic device 501. According to an embodiment, all or some of operations to be executed at the electronic device 501 may be executed at one or more of the external electronic devices 502, 504, or 508. For example, if the electronic device 501 should perform a function or a service automatically, or in response to a request from a user or another device, the electronic device 501, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 501. The electronic device 501 may provide the outcome, with or without further processing of the outcome, as at least part of a reply to the request. To that end, a cloud computing, distributed computing, mobile edge computing (MEC), or client-server computing technology may be used, for example. The electronic device 501 may provide ultra low-latency services using, e.g., distributed computing or MEC. In another embodiment, the external electronic device 504 may include an Internet-of-things (IoT) device. The server 508 may be an intelligent server using machine learning and/or a neural network. According to an embodiment, the external electronic device 504 or the server 508 may be included in the second network 599. The electronic device 501 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 540) including one or more instructions that are stored in a storage medium (e.g., internal memory 536 or external memory 538) that is readable by a machine (e.g., the electronic device 501). For example, a processor (e.g., the processor 520) of the machine (e.g., the electronic device 501) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to certain embodiments thereof, it will be understood by those skilled in the art that various changes in form and details may be made therein without departing from the scope of the disclosure. Therefore, the scope of the disclosure should not be defined as being limited to the embodiments, but should be defined by the appended claims and equivalents thereof.

What is claimed is:

1. An electronic device, comprising:
    a printed circuit board (PCB) including a first alignment mark formed on a first surface of the PCB; and
    a rigid flexible PCB (RFPCB) including:
    a plurality of layers;
    a rigid portion disposed on the first surface of the PCB;
    a flexible portion extending from the rigid portion; and
    a first protrusion formed as one of the plurality of layers protruding and extending from the rigid portion,
    wherein a second alignment mark corresponding to the first alignment mark of the PCB is defined in the first protrusion, and
    wherein the first protrusion overlaps at least partially with the first alignment mark of the PCB.

2. The electronic device of claim 1, wherein a third alignment mark is formed on the first surface of the PCB,
    wherein the RFPCB includes a second protrusion spaced apart from the first protrusion, and formed as the one of the plurality of layers protruding and extending from the rigid portion, and
    wherein the second protrusion having a fourth alignment mark defined in the second protrusion overlaps at least partially with the third alignment mark of the PCB.

3. The electronic device of claim 2, wherein the flexible portion extends from the rigid portion at a location between the first protrusion and the second protrusion.

4. The electronic device of claim 1, wherein the one of the plurality of layers protruding and extending from the rigid portion includes:
    a first flexible film layer;
    a first conductive layer formed on the first flexible film layer; and
    a first cover layer for covering the first conductive layer in the flexible portion.

5. The electronic device of claim 4, wherein the RFPCB includes:
    a second flexible film layer;
    a second conductive layer formed on the second flexible film layer;
    a second cover layer for covering the second conductive layer in the flexible portion; and
    a rigid insulating layer disposed between the first flexible film layer and the second conductive layer in the rigid portion.

6. The electronic device of claim 5, further comprising a conductive via at least partially penetrating the rigid portion such that the first conductive layer and the second conductive layer are electrically connected to each other.

7. The electronic device of claim 5, wherein the first flexible film layer includes polyimide,
    wherein the first conductive layer includes copper,
    wherein the first cover layer includes polyimide, and
    wherein the rigid insulating layer includes a prepreg.

8. The electronic device of claim 4, further comprising an adhesive layer interposed between the first conductive layer and the first cover layer.

9. The electronic device of claim 4, further comprising a shielding layer for at least partially surrounding the flexible portion.

10. The electronic device of claim 4, wherein the first protrusion is formed as the first flexible film layer, the first conductive layer, and the first cover layer protruding and extending from the rigid portion.

11. The electronic device of claim 10, wherein the second alignment mark of the first protrusion includes an opening defined by removing the first flexible film layer and the first conductive layer.

12. The electronic device of claim 1, wherein the PCB includes first conductive pads formed on the first surface, and
    wherein the RFPCB includes second conductive pads formed on a surface of the rigid portion and bonded to the first conductive pads.

13. The electronic device of claim 12, wherein the first conductive pads and the second conductive pads are bonded together using a hot bar process.

14. The electronic device of claim 1, wherein the rigid portion includes a top surface, a bottom surface facing the PCB, and a side surface extending from an edge of the top surface to an edge of the bottom surface, and
    wherein the first protrusion protrudes from the side surface of the rigid portion.

15. The electronic device of claim 1, wherein the first alignment mark of the PCB includes a conductive pad exposed through the first surface.

16. A rigid flexible printed circuit board (RFPCB), the RFPCB comprising:
    a plurality of layers bonded to a printed circuit board (PCB);
    a rigid portion disposed on a first surface of the PCB;
    a flexible portion extending from the rigid portion; and
    a first protrusion formed as one of the plurality of layers protruding and extending from the rigid portion,
    wherein a second alignment mark corresponding to a first alignment mark formed on the first surface of the PCB is defined in the first protrusion, and
    wherein the first protrusion overlaps at least partially with the first alignment mark of the PCB.

17. The RFPCB of claim 16, further comprising a second protrusion spaced apart from the first protrusion, and formed as the one of the plurality of layers protruding and extending from the rigid portion,
    wherein a fourth alignment mark corresponding to a third alignment mark formed on the first surface of the PCB is defined in the second protrusion, and
    wherein the second protrusion overlaps at least partially with the third alignment mark of the PCB.

18. The RFPCB of claim 17, wherein the flexible portion extends from the rigid portion at a location between the first protrusion and the second protrusion.

19. The RFPCB of claim 16, wherein the one of the plurality of layers includes:
    a first flexible film layer;
    a first conductive layer formed on the first flexible film layer;

a first cover layer for covering the first conductive layer in the flexible portion; and an adhesive layer interposed between the first conductive layer and the first cover layer.

20. The RFPCB of claim 19, wherein the first protrusion is formed as the first flexible film layer, the first conductive layer, the adhesive layer, and the first cover layer protruding and extending from the rigid portion, and wherein the second alignment mark of the first protrusion includes an opening defined by removing the first flexible film layer and the first conductive layer.

\* \* \* \* \*